(12) United States Patent
Takahashi et al.

(10) Patent No.: US 6,225,878 B1
(45) Date of Patent: *May 1, 2001

(54) MILLIMETER WAVE MODULE AND RADIO APPARATUS

(75) Inventors: Kazuaki Takahashi, Tokyo; Ushio Sangawa, Kanagawa, both of (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/323,798

(22) Filed: Jun. 1, 1999

(30) Foreign Application Priority Data

Jun. 2, 1998 (JP) .................................... 10-152458

(51) Int. Cl.⁷ ...................................................... H01P 1/203
(52) U.S. Cl. .......................... 333/204; 333/247; 257/728; 257/778; 257/664
(58) Field of Search ..................................... 333/204, 247, 333/246; 257/664, 728, 778; 343/700 MS

(56) References Cited

U.S. PATENT DOCUMENTS

| 5,608,263 | 3/1997 | Drayton et al. ........................ 257/728 |
| 5,990,768 | * 11/1999 | Takahashi et al. ................... 333/247 |
| 6,040,806 | * 3/2000 | Kushishi et al. ...................... 343/853 |
| 6,074,897 | * 6/2000 | Degani et al. ......................... 438/115 |

* cited by examiner

*Primary Examiner*—Benny Lee
*Assistant Examiner*—Stephen E. Jones
(74) *Attorney, Agent, or Firm*—Ratner & Prestia

(57) ABSTRACT

A millimeter wave module includes a silicon substrate with first and second cavityes formed by anisotropic etching on the silicon substrate, and a glass substrate having a microstrip filter pattern and microbumps for connecting the glass substrate to the silicon substrate. A filter is provided using an air layer as a dielectric disposed in the first cavity. An MMIC is mounted by the flip chip method over the second air layer. A coplanar waveguide is on the silicon substrate for connecting the filter and MMIC. The filter having low loss is achieved because it has the microstrip structure using air as an insulating layer. Also change in characteristics of the MMIC during mounting is eliminated because the MMIC is protected by contacting air. Accordingly, the millimeter wave module has excellent characteristics and is made using a simple method.

7 Claims, 10 Drawing Sheets

MILLIMETER WAVE MODULE AND RADIO APPARATUS

FIELD OF THE INVENTION

The present invention relates to the field of high frequency modules using millimeter waves or microwaves, and radio apparatuses employing such modules.

BACKGROUND OF THE INVENTION

One known millimeter waveguide using anisotropically etched silicon substrate is disclosed in IEEE MTT–S Digest pp. 797–800, 1996.

FIG. 10 shows the structure of a conventional millimeter wave transmission line. Silicon dioxide ($SiO_2$) 902 is deposited on a silicon substrate 901, and a microstrip line 903 is formed on the silicon dioxide 902. A shielded microstrip line is created by sandwiching the silicon substrate 901 between a carrier substrate 904 coated with metal film, and another silicon substrate 905 processed by micromachining, to achieve a shielding structure. With this shielding structure, which uses air as the dielectric medium, a transmission line with low loss can be achieved.

In this type of millimeter transmission line, however, modularization by mounting other millimeter wave components such as an MMIC (Monolithic Microwave Integrated Circuit) may be difficult, because the microstrip line is supported by silicon dioxide in midair. There may also be a problem with strength. Two sheets of silicon substrate are processed by micromachining, and an unduly thick silicon dioxide film must be formed to ensure strength. These result in the need for complicated processing during manufacturing.

SUMMARY OF THE INVENTION

The present invention offers an inexpensive millimeter wave and microwave apparatus by facilitating processing of a millimeter wave module in which components such as a low-loss filter and MMIC are mounted.

A millimeter wave module of the present invention comprises first and second substrates. The first substrate comprises a cavity on one flat face, a conductor formed on the bottom and side faces of the cavity, a connection part formed on a flat face around the cavity and electrically connected to the conductor formed in the cavity, and an air layer inside the cavity. The second substrate made of dielectrics comprises, on one flat face, metal patterning of a microstrip filter and a connection part connected to the metal patterning. The second substrate is mounted on the first substrate, so that the connection part of the first substrate is attached to the connection part connected to the metal patterning of the second substrate, and that the metal patterning of the second substrate faces the air layer in the cavity of the first substrate and also covers the cavity.

With this configuration, a low-loss filter using air as dielectric loss free materials may be easily achieved, and a device face of MMIC may be protected without any degradation. In addition, a low-loss filter and MMIC may be easily connected.

Using a millimeter wave module manufactured in accordance with the above simple method, an inexpensive radio apparatus may be achieved.

DESCRIPTION OF THE PREFERRED EMBODIMENTS

The present invention offers a low-loss filter using an air layer as dielectric loss free materials by mounting a dielectric substrate having a metal pattern onto a semiconductor substrate having multiple cavities and a metal pattern on its surface. Mounting of other millimeter wave components is also facilitated. Since the use of a thin silicon dioxide film which has insufficient mechanical strength is eliminated, the millimeter wave module may be easily manufactured. Exemplary embodiments of the present invention are described below with reference to FIGS. 1 to 9.

First Exemplary Embodiment

Figure 1A:
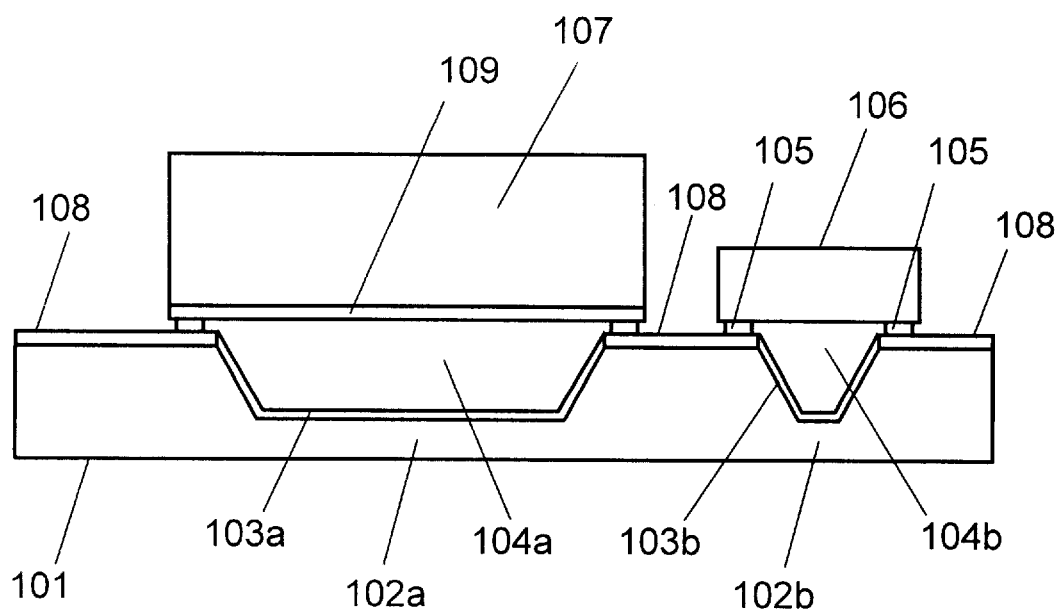
FIG. 1A is a sectional view of a structure of a millimeter wave module in accordance with a first exemplary embodiment of the present invention.
Figure 1B:
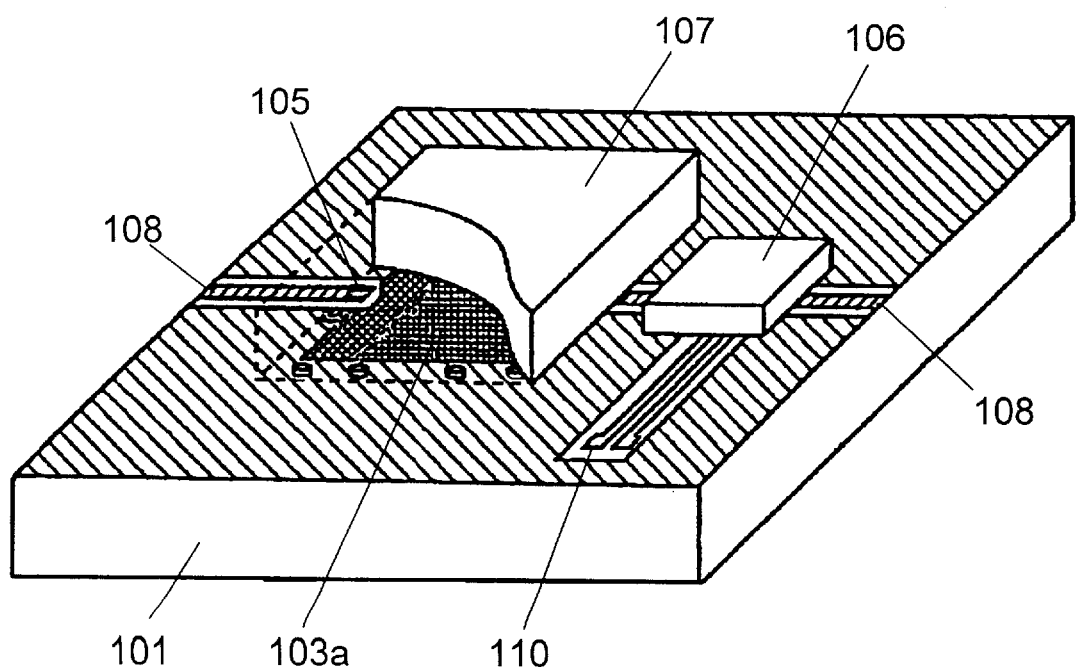
FIG. 1B is a conceptual perspective view of the millimeter wave module in accordance with the first exemplary embodiment of the present invention.

A millimeter wave module in a first exemplary embodiment of the present invention is described with reference to FIGS. 1A and 1B.

Multiple rectangular cavities 102a and 102b are formed by anisotropic etching on a surface of a silicon single crystal substrate 101. Metal ground layers 103a and 103b are deposited on the bottom and side faces, as ground plane, of each of the cavities 102a and 102b. A coplanar waveguide 108 is formed on the flat face around the cavities 102a and 102b on the surface of the silicon single crystal substrate 101, in order to connect metal ground layers 103a and 103b in the cavities 102a and 102b, and to act as I/O terminals. Connection parts are also formed on the flat face around the cavities 102a and 102b for the use in mounting. These connection parts are electrically connected to the metal ground layers 103a and 103b formed in the cavities 102a and 102b. Air layers 104a and 104b exist inside the cavities 102a and 102b.

Metal patterning 109 for the microstrip filter is formed on one face of a glass substrate 107, which comprises the dielectric substrate, and Au microbumps 105 are provided at the periphery of the metal patterning 109, for the use in mounting, as a connection part for the metal patterning 109.

Other Au microbumps 105 for the use in mounting are formed at the periphery of an MMIC 106.

The glass substrate 107 is mounted on the silicon single crystal substrate 101, through the Au bumps 105, so that the metal patterning 109 of the microstrip filter of the glass substrate 107 faces the air layer 104a and covers the cavity 102a of the silicon substrate 101.

The millimeter wave MMIC 106 is mounted above the cavity 102b through the Au bumps so as to cover the cavity 102b.

In other words, the metal patterning 109 of the microstrip filter and millimeter MMIC 106 are configured to respectively face the air layers 104a and 104b. The metal patterning 109 of the microstrip filter and millimeter MMIC 106 are also connected to the coplanar waveguide 108 through the Au bumps 105. A bias pad 110 supplies bias to the MMIC 106.

With the above structure, the electric field of the microstrip filter is mostly concentrated on the air layer 104a which has no dielectric loss, enabling the creation of a low-loss filter.

In addition, the cavity 102b is also provided on the silicon substrate 101 directly under the millimeter MMIC to be mounted so as to form the air layer 104b near an active element. Mounting through the Au bumps 105 enables the achievement of high mounting position accuracy, suppressing any deterioration of its characteristics.

Furthermore, provision of the coplanar waveguide 108 for connecting the glass substrate 107 and MMIC 106 enables the simplification of processing of the silicon substrate 101.

Consequently, an inexpensive radio apparatus is realized by employing a millimeter wave module manufactured according to the above simple method.

The first exemplary embodiment describes the configuration of the one filter and one MMIC. However, more than one filter and MMIC may be combined in many ways.

In this exemplary embodiment, cavities are processed by anisotropic etching. It is apparent that the same shape is achievable by dry etching.

Second Exemplary Embodiment

Figure 2A:
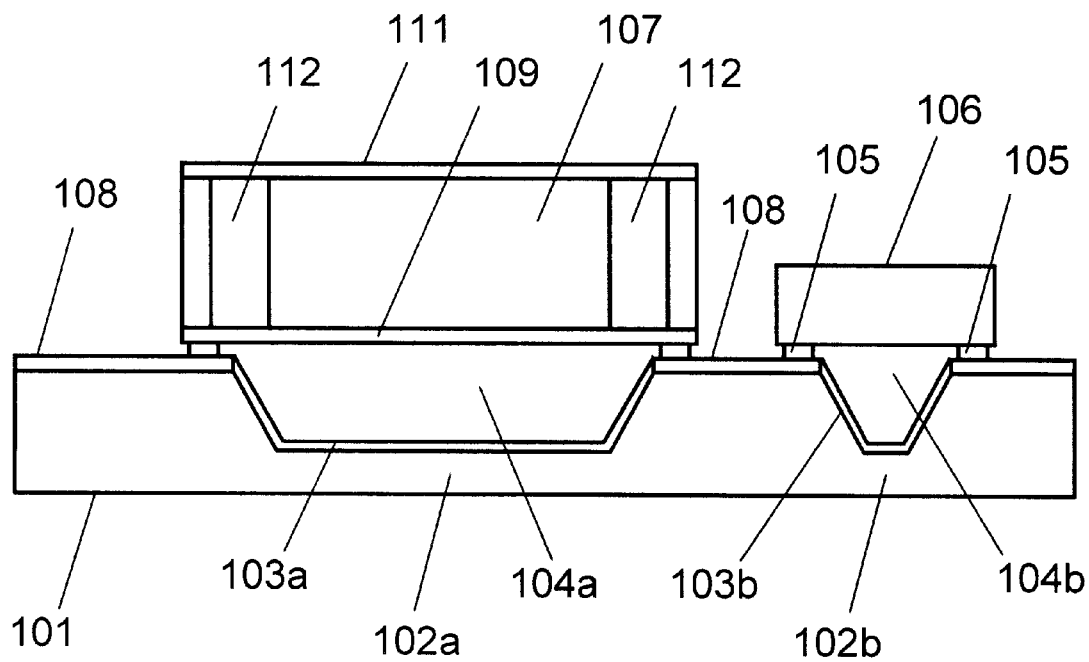
FIG. 2A is a sectional view of a structure of a millimeter wave module in accordance with a second exemplary embodiment of the present invention.
Figure 2B:
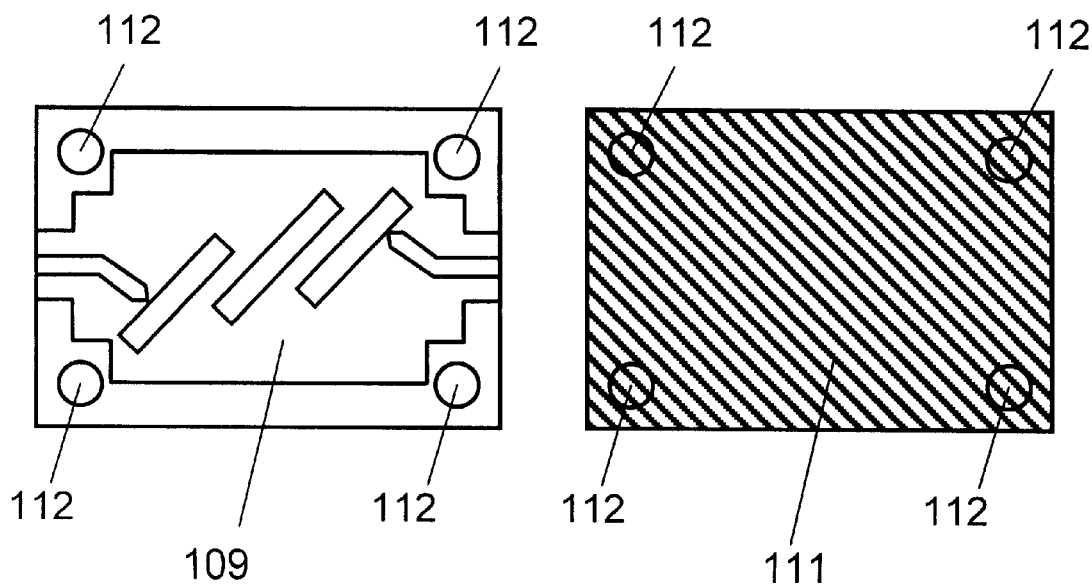
FIG. 2B is a structural view of the surface and rear faces of a glass substrate used in the millimeter wave module in accordance with the second exemplary embodiment of the present invention.

FIGS. 2A and 2B are conceptual views of a structure of a millimeter wave module in a second exemplary embodiment of the present invention. FIG.2A is a sectional view, and FIG. 2B, shows the state of the surface and rear faces. The difference with the first exemplary embodiment and FIGS. 2A and 2B is that a ground plane 111 is provided on the rear face of the glass substrate 107 on which the metal patterning 109 of the microstrip filter is not formed. This ground plane 111 is connected to the metal ground layer 103a of the silicon substrate 101 through a through hole 112. Other components are the same as those in FIG. 1, and thus detailed explanation is omitted here.

With the above configuration, an electric field generated near the metal patterning 109 of the microstrip filter is shielded by surrounding it with the metal ground layer 103a and ground plane 111 from the top and bottom. This suppresses loss or deterioration by radiation of the electric field. At the same time, change in the filter characteristics may be prevented when the millimeter wave module of the present invention is packaged onto the housing.

Furthermore, shielding of the metal patterning of the filter by top and bottom ground planes prevents radiation of the electric field.

Consequently, an inexpensive radio apparatus is realized by employing a millimeter wave module manufactured according to the above simple method.

Third Exemplary Embodiment

Figure 3:
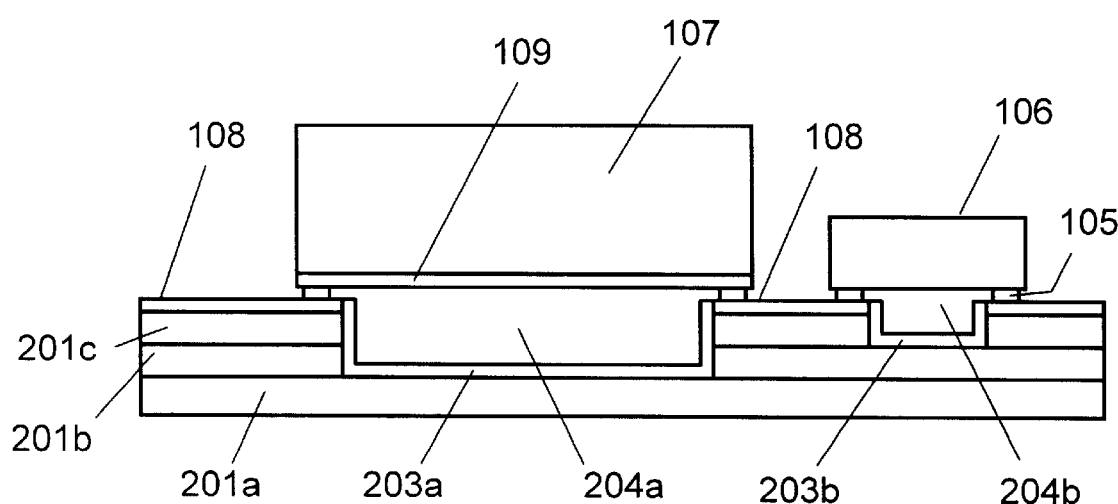
FIG. 3 is a sectional view of a structure of a millimeter wave module in accordance with a third exemplary embodiment of the present invention.

FIG. 3 shows a conceptual view of a sectional structure of a millimeter wave module in a third exemplary embodiment of the present invention. The difference with the first exemplary embodiment in FIG. 3 is that a third substrate 201 (201a, 201b, and 201c) is employed instead of the silicon substrate 101. The same shape of cavity as on the silicon substrate 101 is formed on the third substrate 201 by laminating two layers of first ceramic substrates 201b and 201c, on which a rectangular hole is provided, and a second ceramic substrate 201a without a hole. Ground layers 203a and 203b are deposited on the bottom and side faces of the cavities to form air layers 204a and 204b. Other components are the same as those in FIG. 1, and thus detailed explanation is omitted here.

With the above configuration, the same effect as produced by the first exemplary embodiment is achievable by the use of inexpensive ceramic substrate.

In the third exemplary embodiment, two layers of ceramic substrates 201b and 201c configure the first ceramic substrate. This configuration facilitates the adjustment of the thickness of the air layers as required, i.e., the thickness of the air layer 204a corresponds to two ceramic layers and the thickness of the air layer 204b corresponds to one ceramic layer.

In this exemplary embodiment, the third ceramic substrate 201 is made of three layers. However, it is apparent that the same effect is achievable with four layers or more.

Also in this exemplary embodiment, an organic material such as BCB (benzocyclobutene) or polyimide may be used as the dielectrics instead of the ceramic substrate. As a result of the use of organic material, more accurate dimensions for cavities may be achieved than with the ceramic substrate, enabling the further improvement of millimeter wave characteristics.

Accordingly, an inexpensive radio apparatus is realized by employing a millimeter wave module manufactured using the above simple method.

Fourth Exemplary Embodiment

Figure 4:
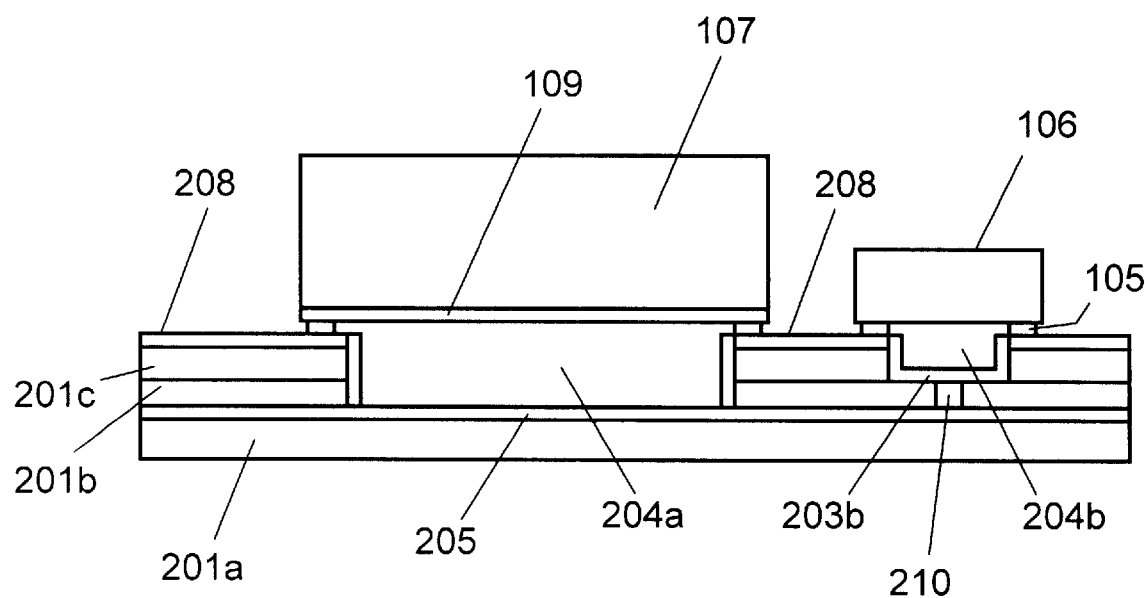
FIG. 4 is a sectional view of a structure of a millimeter wave module in accordance with a fourth exemplary embodiment of the present invention.

FIG. 4 is a conceptual view of a sectional structure of a millimeter wave module in a fourth exemplary embodiment of the present invention. The difference with the third exemplary embodiment in FIG. 4 is that a ground plane 205 is provided between bonded faces of the second ceramic substrate 201a without hole and one of the first ceramic substrate 201b with hole. The ground layer 203b provided on the bottom and side faces of the cavity and a ground plane 205 are connected by a through hole 210 so as to connect between the glass substrate 107 and MMIC 106 not with the coplanar waveguide instead of the microstrip line. Other components are the same as those in FIG. 1, and thus detailed explanation is omitted here. With the above configuration, various components such as a filter and MMIC may be connected using the microstrip line instead of the coplanar waveguide, eliminating the need of a converter between the coplanar and microstrip lines, and thus facilitating designing.

Consequently, an inexpensive radio apparatus is realized by employing a millimeter wave module manufactured using the above simple method.

Fifth Exemplary Embodiment

Figure 5:
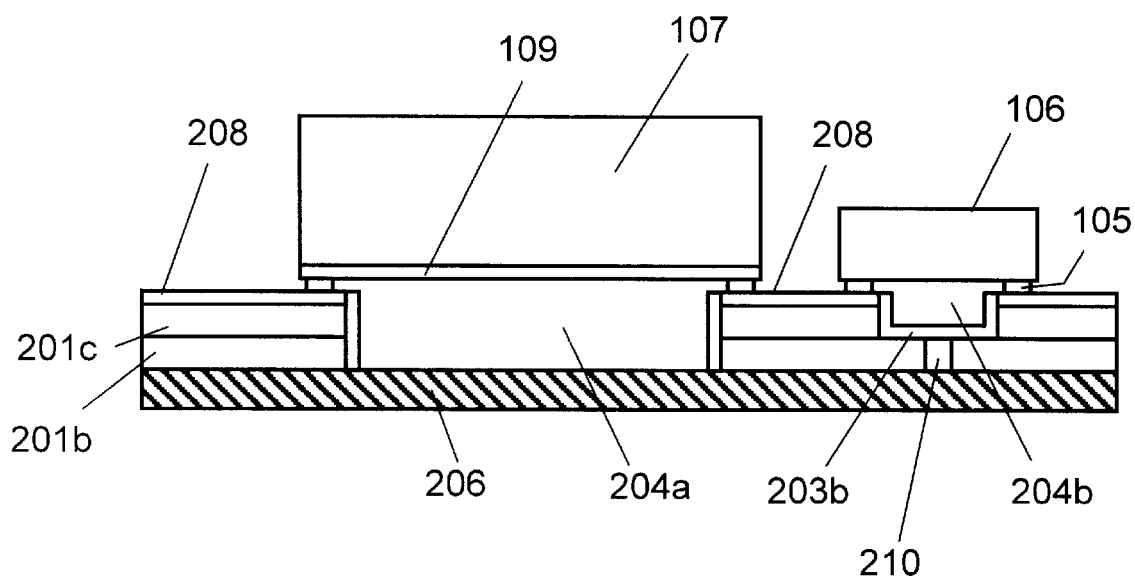
FIG. 5 is a sectional view of a structure of a millimeter wave module in accordance with a fifth exemplary embodiment of the present invention.

FIG. 5 is a conceptual view of a sectional structure of a millimeter wave module in a fifth exemplary embodiment of the present invention. The difference with the fourth exemplary embodiment in FIG. 5 is that a conductive metal 206 such as aluminum or brass is used instead of the ceramic substrate 201a without hole. Other components are the same as those in FIG. 4, and thus detailed explanation is omitted here. With the above configuration, an inexpensive module with a simple structure and the same effect as the fourth exemplary embodiment may be achieved.

Consequently, an inexpensive radio apparatus is realized by employing a millimeter wave module manufactured using the above simple method.

Sixth Exemplary Embodiment

Figure 6A:
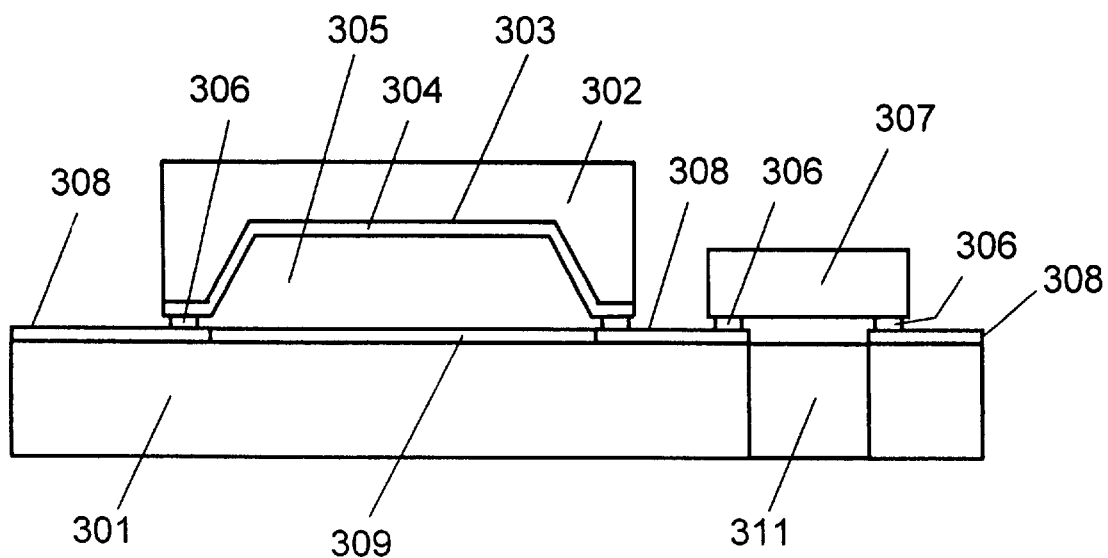
FIG. 6A is a sectional view of a structure of a millimeter wave module in accordance with a sixth exemplary embodiment of the present invention.
Figure 6B:
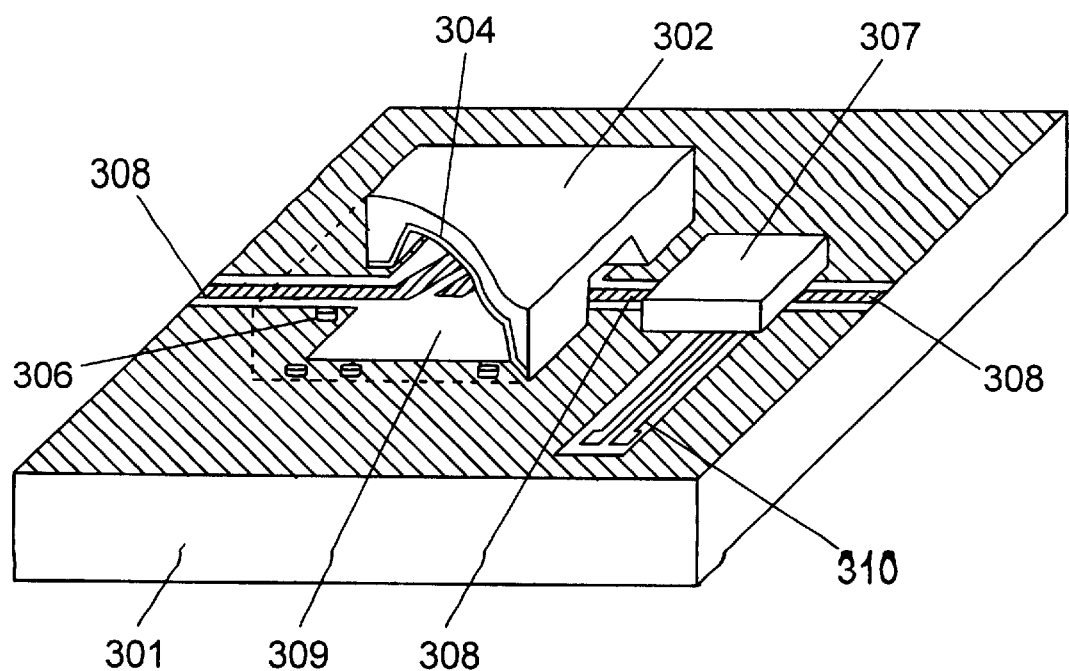
FIG. 6B is a conceptual perspective view of a millimeter wave module in accordance with a sixth exemplary embodiment of the present invention.

FIGS. 6A and 6B are conceptual views of a structure of a millimeter wave module in a sixth exemplary embodiment of the present invention. FIG. 6A is a sectional view and FIG. 6B is a perspective view.

Metal patterning 309 of a microstrip filter and a coplanar waveguide 308 are formed on a glass substrate 301, and a rectangular hole 311 is provided on the glass substrate 301. This rectangular hole 311 may be either a through hole or cavity.

A cavity 303 formed by anisotropic etching is created on a silicon substrate 302, and a metal ground layer 304 is deposited as a ground face on the bottom and side faces of the cavity 303. In addition, an Au microbumps 306 is formed on a flat face around the cavity 303, for the use in mounting, as a connection part electrically connected to the metal ground layer 304 formed on the cavity 303. An air layer 305 exists in the cavity 303.

Another Au microbumps 306 for the use in mounting is formed at the periphery of a MMIC 307.

The silicon substrate 302 is mounted onto the glass substrate 301 through the Au microbumps 306, and the metal ground layer 304 deposited in the cavity 304 is connected to the coplanar waveguide 308. The millimeter wave MMIC 307 is mounted on the glass substrate 301 through the Au microbumps 306, and connected to the coplanar waveguide 308, also through the Au microbumps 306. A bias pad 310 supplies bias to the millimeter MMIC 307.

With the above configuration, the microstrip filter using the air layer 305 as an insulating layer is achieved, same as in the first exemplary embodiment, and thus a low-loss filter is realized.

By providing a rectangular hole 311 on the glass substrate 301 directly under the mounted millimeter MMIC 307, an active element may face with air. This enables to suppress deterioration in characteristics of the MMIC, which may be caused by mounting through the Au microbumps.

Consequently, an inexpensive radio apparatus is realized by employing a millimeter wave module manufactured using the above simple method.

Seventh Exemplary Embodiment

Figure 7A:
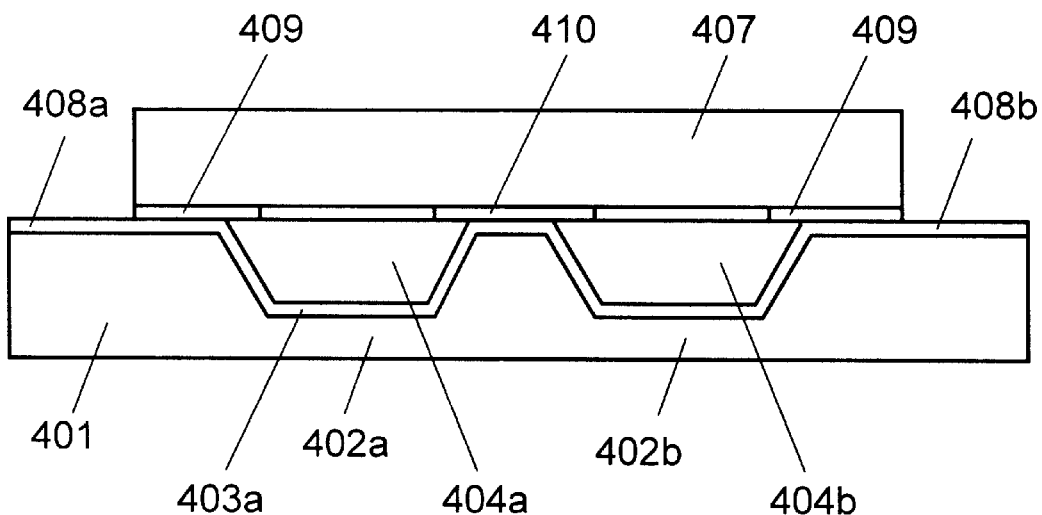
FIG. 7A is a sectional view of a structure of a millimeter wave module in accordance with a seventh exemplary embodiment of the present invention.
Figure 7B:
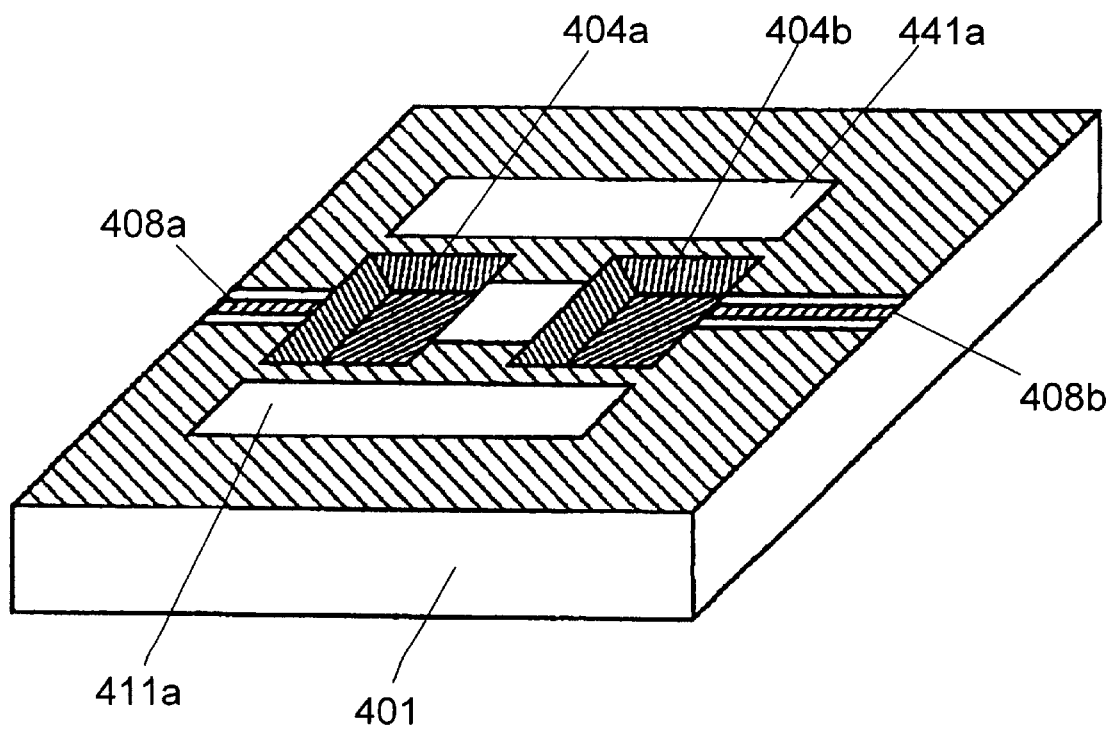
FIG. 7B is a conceptual perspective view of a silicon substrate used in the millimeter wave module in accordance with the seventh exemplary embodiment of the present invention.
Figure 8:
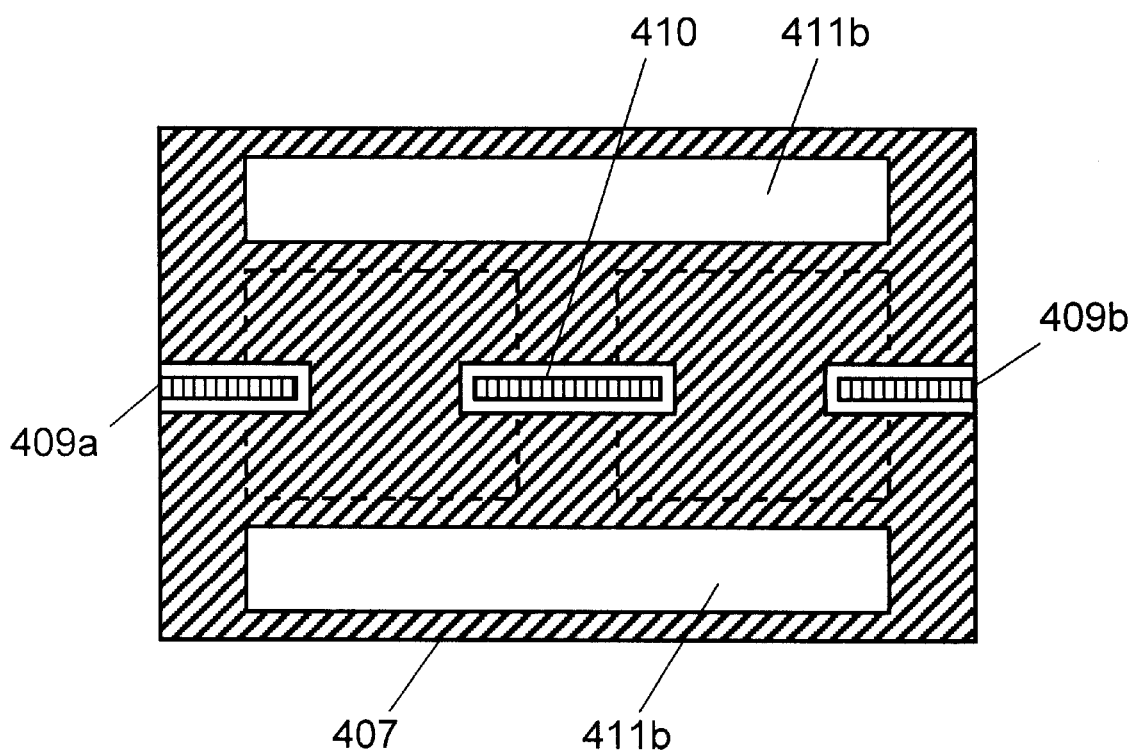
FIG. 8 is a structural view of a surface of a glass substrate used in the millimeter wave module in accordance with the seventh exemplary embodiment of the present invention.

FIGS. 7A, 7B, and 8 show the conceptual structure of a millimeter wave module in a seventh exemplary embodiment. FIG. 7A is a sectional view, FIG. 7B is a perspective view, and FIG. 8 is a conceptual view illustrating the surface structure of the glass substrate used in the millimeter wave module in FIG. 7.

A millimeter wave module comprising a low-loss filter configured with two cavity resonators is described.

FIG. 7, a silicon substrate 401 is provided with cavities 402a and 402b formed by anisotropic etching. Metal ground layers 403a and 403b are deposited as ground faces on the bottom and side faces of each cavity 402a and 402b. First and second coplanar waveguides 408a and 408b connected between metal ground layers 403a and 403b of each cavity are formed on the surface of a silicon single crystal substrate 401. The ground metal is formed on substantially the entire face of the silicon substrate 401, as shown in FIG. 7B by the slanted line, so as to be insulated from the first and second coplanar waveguides 408a and 408b.

On one face of the glass substrate 407, third and fourth coplanar waveguides 409a and 409b, and a fifth coplanar waveguide patterning 410 are provided. Ground metal is formed on substantially the entire bottom face of the glass substrate 407, as shown in FIG. 8 by the slanted line, except for areas where the coplanar waveguides 409a, 409b, and 410 are formed.

Two windows 411a formed on the silicon substrate 401 and two windows 411b formed on the glass substrate 407 are the portions where the ground metal is removed. The silicon substrates 401 and glass substrate 407 are bonded by anodic bonding at these windows.

The two spaces enclosed by the cavities 402a and 402b and the ground metal formed on the glass substrate act as cavity resonators which resonate at frequencies determined by the condition that half the wavelength in free space is nearly equal to the lengths of the cavities 402a or 402b. These two cavity resonators are connected by the fifth coplanar waveguide wiring 410 provided on the glass substrate 407. To form an I/O terminal on the silicon substrate 401, the third coplanar waveguide 409a is connected with a cavity resonator with an air layer 404a, and the fourth coplanar waveguide 409b is connected with a cavity resonator with an air layer 404b. This completes the cavity resonator filter configured with coplanar waveguides using the first and second coplanar waveguides 408a and 408b as I/O terminals.

Since the Q value of the cavity resonator is high, a low-loss filter is achievable. In addition, the height of the air layer 404 is highly accurate because the silicon substrate 401 and glass substrate 407 are bonded at the windows 411 by anodic bonding, achieving the intended accurate resonance frequency.

Furthermore, since the I/O terminal has a coplanar structure, connection with other components such as an MMIC is easily achievable.

Consequently, an inexpensive radio apparatus is realized by employing a millimeter wave module manufactured according to the above simple method.

This exemplary embodiment employs anodic bonding as the method for bonding the silicon substrate 401 and glass substrate 407. However, it is apparent that the mounting method using Au micro bumps, as in other exemplary embodiments, is applicable.

Eighth Exemplary Embodiment

Figure 9:
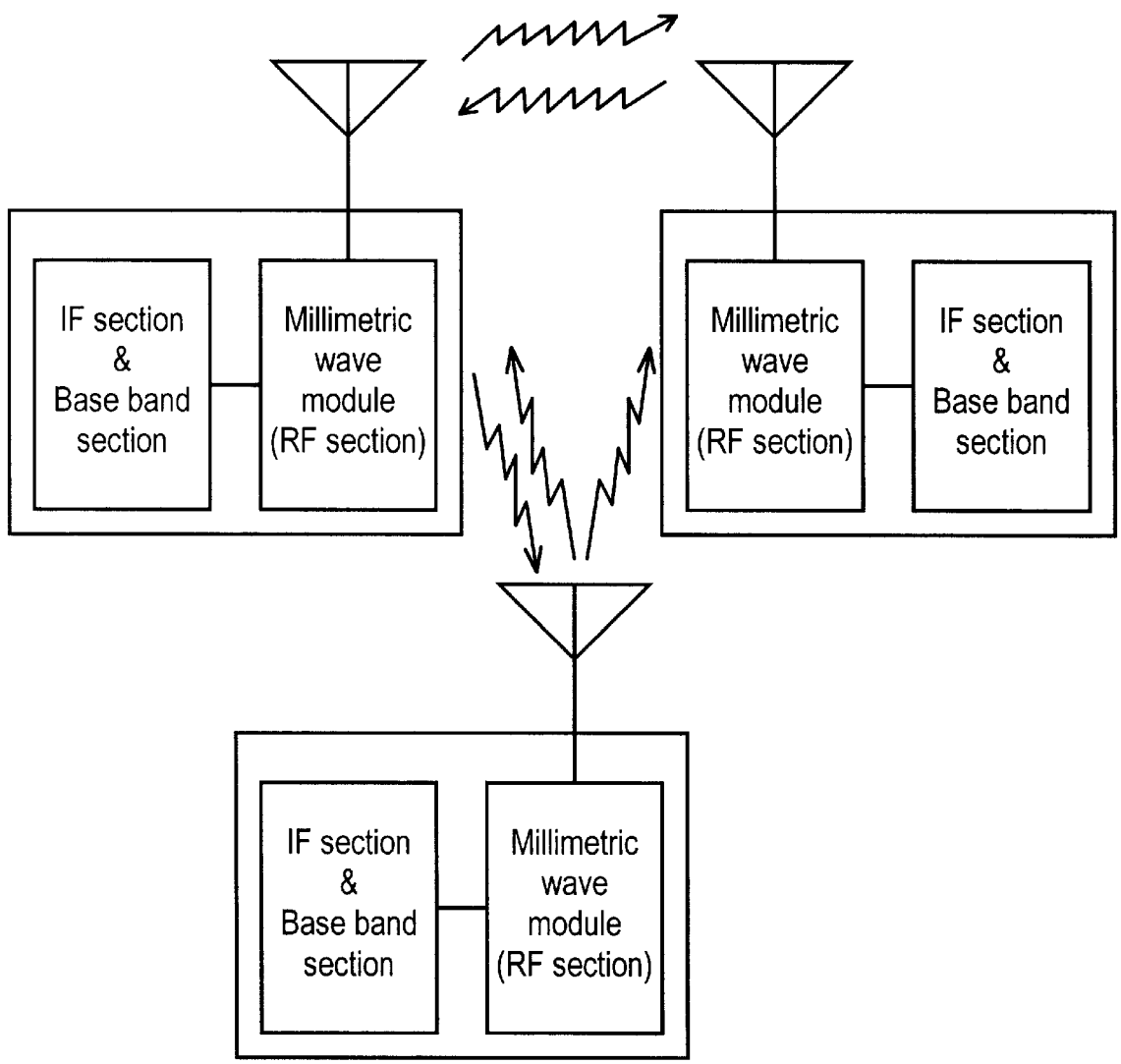
FIG. 9 is a radio apparatus in accordance with an eight exemplary embodiment of the present invention.
Figure 10:
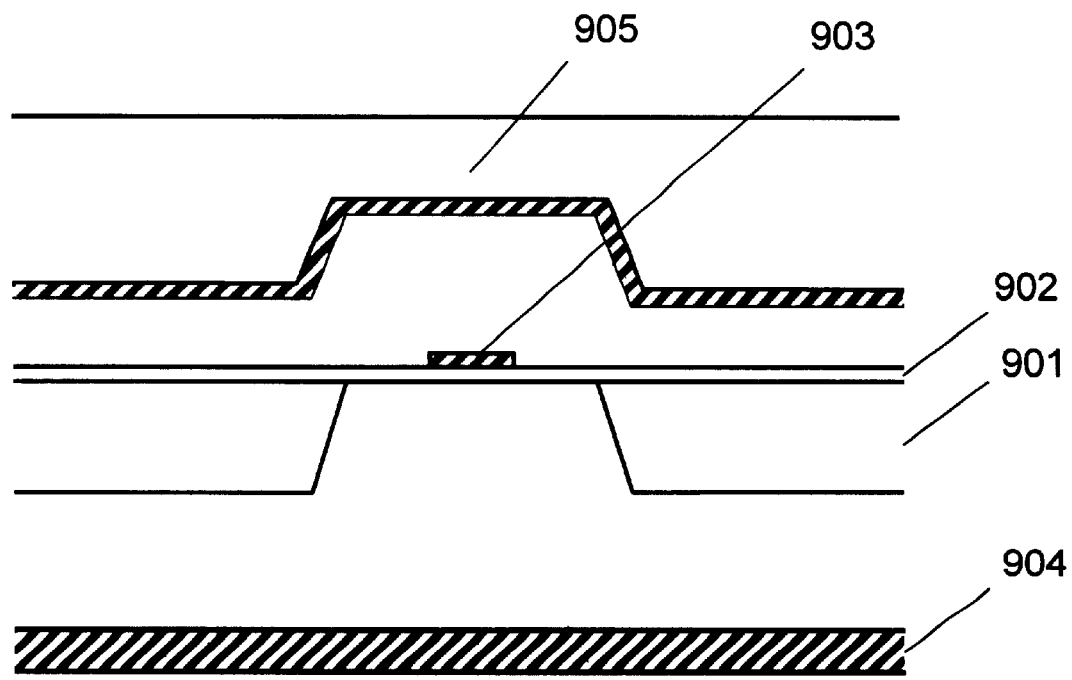
FIG. 10 is a sectional view of a structure of a conventional millimeter wave transmission line.

FIG. 9 shows a radio apparatus in an eighth exemplary embodiment of the present invention. It is a conceptual view illustrating communications among multiple radio apparatuses employing the millimeter wave module described in the first to seventh exemplary embodiments.

As shown in FIG. 9, a small but high-performance millimeter wave module manufactured according to a simple method described in the first to seventh exemplary embodiments is built in RF section of each radio apparatus. Accordingly, a small inexpensive radio apparatus is achievable.

As described above, the present invention enables a low-loss filter on a semi-flat structure to be achieved using a simple processing method, and also facilitates connection with other components such as an MMIC. Thus, the advantageous effects of realizing a millimeter wave module satisfying both the requirements of smaller size and higher performance, and an inexpensive radio apparatus employing such millimeter wave module are achieved.

The exemplary embodiments of the present invention describe an example of connection through Au microbumps as a method for mounting components such as MMICs. However, other surface mounting technologies, including flip-chip mounting through solder bumps, are similarly applicable.

The exemplary embodiments of the present invention also describe an example of processing cavities on a silicon substrate using anisotropic etching. Other processing method such as dry etching is similarly applicable.

What is claimed is:

1. A millimeter wave module comprising:
   1) a first substrate having a face, said fist substrate further having:
      a) a first cavity;
      b) a conductor on said face of said substrate;
      c) a connection part on said face of said first substrate and around said first cavity, said connection part being electrically connected with said conductor;
      d) an air layer in said first cavity; and
   2) a second substrate having a face, said second substrate being dielectric substrate and having:
      e) a microstrip filter having metal patterning on said face of said second substrate; and
      f) a connection pant connected to said metal patterning; said second substrate mounted to said first substrate by connecting the connection part of said first substrate with said connection part connected to said metal patterning, with said metal patterning facing said air layer in said first cavity and covering said first cavity.

2. The millimeter wave module as defined in claim 1, wherein said first substrate is of a silicon single crystal substrate, and said cavity is formed by anisotropic etching.

3. The millimeter wave module as defined in claim 1, wherein said first substrate is of a silicon substrate, and said cavity is formed by dry etching.

4. The millimeter wave module as defined in claim 1, wherein said first and second substrates are mutually connected by said connection part of said first substrate and said connection part of said second substrate applying flip-chip mounting technology.

5. A radio apparatus employing the millimeter wave module defined in claim 1.

6. A millimeter wave module comprising:
   a dielectric substrate having on a face thereof metal patterning by a coplanar waveguide, metal patterning of a microstrip filter, and a rectangular hole; and
   a silicon single crystal substrate in which a cavity is formed by anisotropic etching, and a ground conductor is deposited on said silicon single crystal substrate, said silicon single crystal substrate is mounted to said dielectric substrate to rover the metal patterning of the microstrip filter on said dielectric substrate; and
   an MMIC is mounted to said dielectric substrate to cover said rectangular hole provided on said dielectric substrate.

7. A radio apparatus employing the millimeter wave module defined in claim 6.

* * * * *

UNITED STATES PATENT AND TRADEMARK OFFICE
CERTIFICATE OF CORRECTION

PATENT NO. : 6,225,878 B1
DATED : May 1, 2001
INVENTOR(S) : Takahashi et al.

It is certified that error appears in the above-identified patent and that said Letters Patent is hereby corrected as shown below:

<u>Column 8,</u>
Line 3, "pant" should read -- part --.
Line 32, "rover" should read -- cover --.

Signed and Sealed this

Nineteenth Day of March, 2002

Attest:

JAMES E. ROGAN
Director of the United States Patent and Trademark Office

Attesting Officer